United States Patent
Ramsbey et al.

(10) Patent No.: US 6,465,303 B1
(45) Date of Patent: Oct. 15, 2002

(54) METHOD OF MANUFACTURING SPACER ETCH MASK FOR SILICON-OXIDE-NITRIDE-OXIDE-SILICON (SONOS) TYPE NONVOLATILE MEMORY

(75) Inventors: Mark T. Ramsbey, Sunnyvale, CA (US); Narbeh Derhacobian, Belmont, CA (US); Janet Wang, San Francisco, CA (US); Angela Hui, Fremont, CA (US); Tuan Pham, Santa Clara, CA (US); Ravi Sunkavalli, Milpitas, CA (US); Mark Randolph, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/885,490

(22) Filed: Jun. 20, 2001

(51) Int. Cl.[7] ............................................. H01L 21/336
(52) U.S. Cl. ...................................... 438/257; 438/231
(58) Field of Search ................................. 438/257, 440, 438/450, 487, 506, 514, 519, 659, 712

(56) References Cited

U.S. PATENT DOCUMENTS

| | | | |
|---|---|---|---|
| 4,173,766 A | 11/1979 | Hayes | 357/23 |
| 5,168,334 A | 12/1992 | Mitchell et al. | 257/324 |
| 5,349,221 A | 9/1994 | Shimoji | 257/324 |
| 5,644,533 A | 7/1997 | Lancaster et al. | 365/185.18 |
| 5,877,050 A | * 3/1999 | Gardener et al. | 438/231 |
| 5,966,603 A | 10/1999 | Eitan | 438/258 |
| 6,001,709 A | 12/1999 | Chuang et al. | 438/440 |
| 6,030,871 A | 2/2000 | Eitan | 438/276 |

OTHER PUBLICATIONS

"A True Single–Transistor Oxide–Nitride–Oxide EEPROM Device," T.Y. Chan, et al., IEEE Electron Device Letters, vol. EDL 8, No. 3, Mar. 1987.

"An Electrically Alterable Nonvolatile Memory Cell Using a Floating–Gate Structure," Daniel C. Guterman, et al., IEEE Transactions on Electron Devices, vol. ED–26, No. 4, Apr. 1979.

\* cited by examiner

*Primary Examiner*—David Nelms
*Assistant Examiner*—Dung A Le
(74) *Attorney, Agent, or Firm*—Amin & Turocy, LLP

(57) ABSTRACT

One aspect of the present invention relates to a method of forming spacers in a silicon-oxide-nitride-oxide-silicon (SONOS) type nonvolatile semiconductor memory device, involving the steps of providing a semiconductor substrate having a core region and periphery region, the core region containing SONOS type memory cells and the periphery region containing gate transistors; implanting a first implant into the core region and a first implant into the periphery region of the semiconductor substrate; forming a spacer material over the semiconductor substrate; masking the core region and forming spacers adjacent the gate transistors in the periphery region; and implanting a second implant into the periphery region of the semiconductor substrate.

20 Claims, 4 Drawing Sheets

METHOD OF MANUFACTURING SPACER ETCH MASK FOR SILICON-OXIDE-NITRIDE-OXIDE-SILICON (SONOS) TYPE NONVOLATILE MEMORY

TECHNICAL FIELD

The present invention generally relates to fabricating SONOS type nonvolatile memory devices. In particular, the present invention relates to improved methods of fabricating spacers in SONOS type nonvolatile memory devices.

BACKGROUND ART

Conventional floating gate flash memory types of EEPROMs (electrically erasable programmable read only memory), employ a memory cell characterized by a vertical stack of a tunnel oxide, a first polysilicon layer over the tunnel oxide, an ONO (oxide-nitride-oxide) interlevel dielectric over the first polysilicon layer, and a second polysilicon layer over the ONO interlevel dielectric. For example, Guterman et al (IEEE Transactions on Electron Devices, Vol. 26, No. 4, p. 576, 1979) relates to a floating gate nonvolatile memory cell consisting of a floating gate sandwiched between a gate oxide and an interlevel oxide, with a control gate over the interlevel oxide.

Generally speaking, a flash memory cell is programmed by inducing hot electron injection from a portion of the substrate, such as the channel section near the drain region, to the floating gate. Electron injection carries negative charge into the floating gate. The injection mechanism can be induced by grounding the source region and a bulk portion of the substrate and applying a relatively high positive voltage to the control electrode to create an electron attracting field and applying a positive voltage of moderate magnitude to the drain region in order to generate "hot " (high energy) electrons. After sufficient negative charge accumulates on the floating gate, the negative potential of the floating gate raises the threshold voltage of its field effect transistor (FET) and inhibits current flow through the channel region through a subsequent "read" mode. The magnitude of the read current is used to determine whether or not a flash memory cell is programmed. The act of discharging the floating gate of a flash memory cell is called the erase function. The erase function is typically carried out by a Fowler-Nordheim tunneling mechanism between the floating gate and the source region of the transistor (source erase or negative gate erase) or between the floating gate and the substrate (channel erase). A source erase operation is induced by applying a high positive voltage to the source region and a 0 V to the control gate and the substrate while floating the drain of the respective memory cell.

Subsequently, SONOS (Silicon Oxide Nitride Oxide Silicon) type memory devices have been introduced. See Chan et al, IEEE Electron Device Letters, Vol. 8, No. 3, p. 93, 1987. SONOS type flash memory cells are constructed having a charge trapping non-conducting dielectric layer, typically a silicon nitride layer, sandwiched between two silicon dioxide layers (insulating layers). The nonconducting dielectric layer functions as an electrical charge trapping medium. A conducting gate layer is placed over the upper silicon dioxide layer. Since the electrical charge is trapped locally near whichever side that is used as the drain, this structure can be described as a two-transistor cell, or two-bits per cell. If multi-level is used, then four or more bits per cell can be accomplished. Multi-bit cells enable SONOS type memory devices to have the advantage over others in facilitating the continuing trend increasing the amount of information held/processed on an integrated circuit chip.

For simplicity, a two-bit per cell implementation of SONOS is described. While both bits of SONOS type memory devices are programmed in a conventional manner, such as using hot electron programming, each bit is read in a direction opposite that in which it is programmed with a relatively low gate voltage. For example, the right bit is programmed conventionally by applying programming voltages to the gate and the drain while the source is grounded or at a lower voltage. Hot electrons are accelerated sufficiently so that they are injected into a region of the trapping dielectric layer near the drain. The device, however, is read in the opposite direction from which it is written, meaning voltages are applied to the gate and the source while the drain is grounded or at a lower voltage. The left bit is similarly programmed and read by swapping the functionality of source and drain terminals. Programming one of the bits leaves the other bit with its information intact and undisturbed.

Reading in the reverse direction is most effective when relatively low gate voltages are used. A benefit of utilizing relatively low gate voltages in combination with reading in the reverse direction is that the potential drop across the portion of the channel beneath the trapped charge region is significantly reduced. A relatively small programming region or charge trapping region is possible due to the lower channel potential drop under the charge trapping region. This permits much faster programming times because the effect of the charge trapped in the localized trapping region is amplified. Programming times are reduced while the delta in threshold voltage between the programmed versus unprogrammed states remains the same as when the device is read in the forward direction.

SONOS type memory devices offer additional advantages as well. In particular, the erase mechanism of the memory cell is greatly enhanced. Both bits of the memory cell can be erased by applying suitable erase voltages to the gate and the drain for the right bit and to the gate and the source for the left bit. Another advantage includes reduced wear out from cycling thus increasing device longevity. An effect of reading in the reverse direction is that a much higher threshold voltage for the same amount of programming is possible. Thus, to achieve a sufficient delta in the threshold voltage between the programmed and unprogrammed states of the memory cell, a much smaller region of trapped charge is required when the cell is read in the reverse direction than when the cell is read in the forward direction.

The erase mechanism is enhanced when the charge trapping region is made as narrow as possible. Programming in the forward direction and reading in the reverse direction permits limiting the width of the charge trapping region to a narrow region near the drain (right bit) or the source. This allows for much more efficient erasing of the memory cell. Although there are advantages associated with SONOS type non-volatile memory devices, there are disadvantages as well. In many instances, it is desirable to form gate transistors in the periphery region with source and drain regions possessing both lightly doped areas and heavily doped areas. This is accomplished by forming spacers adjacent the transistors on the substrate. However, when forming spacers adjacent the memory cells and various gate transistors in the periphery, damage to device often results. This includes damage to the substrate as well as damage to the ONO dielectric layer in the core region. Such damage may cause leakage currents within the device.

For example, referring to prior art FIG. 1, a nonvolatile memory substrate 12 is provided having a core region 14 and a periphery region 16. An ONO dielectric 17 is positioned in the core region 14 over the substrate 12. Flash memory cells 18 are positioned in the core region 14 while gate transistors 20, such as input/out devices, are positioned in the periphery region 16. A spacer material 22 is deposited over the substrate 12. There is extra space 24 between some of the memory cells 18 to subsequently provide for a contact opening.

Referring to prior art FIG. 2, a portion of the spacer material 22 is etched to form spacers 30 adjacent the memory cells 18 and the gate transistors 20. However, in some instances when etching a portion of the spacer material 22, damage 26 to the substrate 12 results and/or damage 28 to the ONO dielectric 17 results. Reliability of the resultant devices is decreased when there is damage 28 to the ONO dielectric 17. And damage 26 to the substrate 12 often creates an undesirable leakage current.

Referring to prior art FIG. 3, a portion of the core region of a memory device is shown with bit lines 32 and word lines 34. The undesirable leakage current 36 (arrow), resulting from the damage 26 to substrate 12 due to etching the spacer material 22 when forming spacers 30, dramatically lowers the operability and reliability of the memory device. There is an unmet need in the art for high quality nonvolatile memory devices.

SUMMARY OF THE INVENTION

The present invention provides processes for fabricating SONOS type nonvolatile memory devices. Compared to conventional memory fabrication processes, the present invention provides spacers for transistors in the periphery region while not causing damage to the charge trapping dielectric in the core region or to the substrate in the core region. The present invention also leads to fewer defects, improved reliability, and/or improved scaling.

One aspect of the present invention relates to a method of forming spacers in a SONOS type nonvolatile semiconductor memory device, involving the steps of providing a semiconductor substrate having a core region and periphery region, the core region containing SONOS type memory cells and the periphery region containing gate transistors; implanting a first implant into the core region and the periphery region of the semiconductor substrate; forming a spacer material over the semiconductor substrate; masking the core region and forming spacers adjacent the gate transistors in the periphery region; and implanting a second implant into the periphery region of the semiconductor substrate.

Another aspect of the present invention relates to a method of forming spacers in a SONOS type nonvolatile semiconductor memory device, involving the steps of providing a semiconductor substrate having a core region and periphery region, the core region comprising SONOS type memory cells and the periphery region comprising gate transistors, the SONOS type memory cells comprising a charge trapping dielectric and a poly layer; implanting a first implant into the core region to form buried bit lines in the substrate adjacent the SONOS type memory cells and a first implant into the periphery region to form lightly doped regions in the substrate adjacent the gate transistors; depositing a spacer material over the semiconductor substrate in a substantially conformal manner; masking the core region and forming spacers adjacent the gate transistors in the periphery region by etching a portion of the spacer material over the periphery region; and implanting a second implant into the periphery region to form heavily doped regions in the substrate adjacent the lightly doped regions.

DISCLOSURE OF INVENTION

Figure 1:
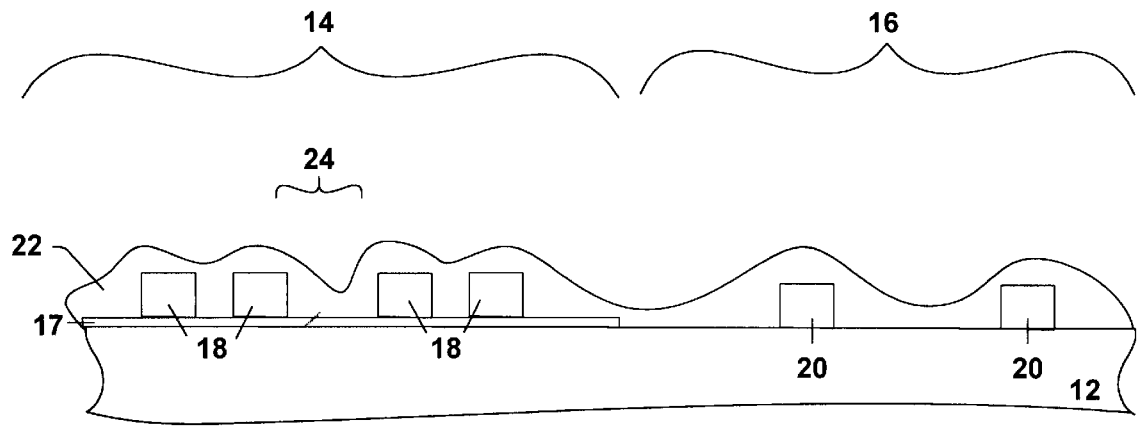
FIG. 1 illustrates a cross-sectional view of a portion of a prior art SONOS type memory cell made in accordance with conventional techniques.
Figure 2:
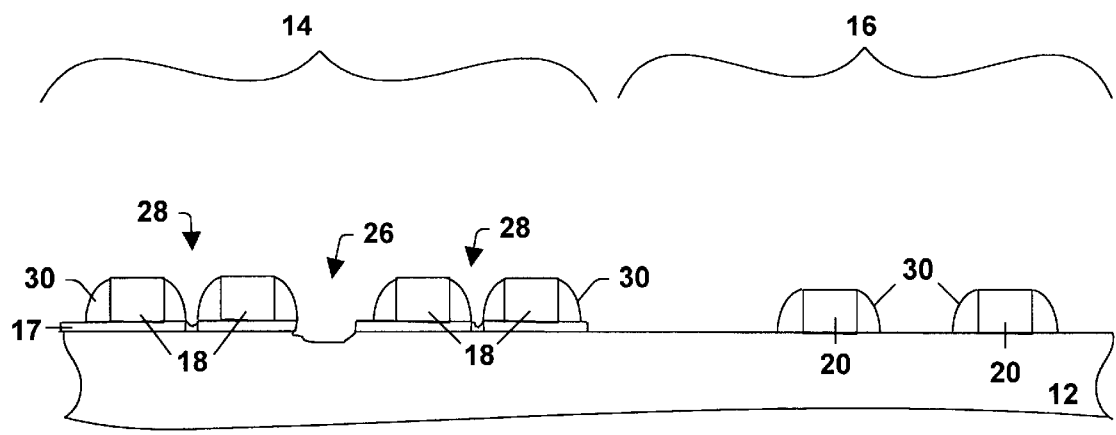
FIG. 2 illustrates another cross-sectional view of the portion of the prior art SONOS type memory cell made in accordance with conventional techniques.
Figure 3:
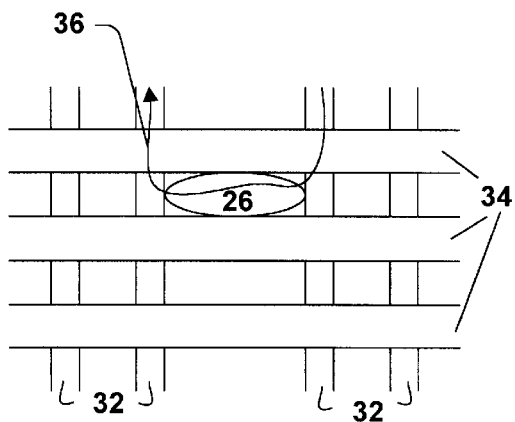
FIG. 3 illustrates a top down view of the portion of the prior art SONOS type memory cell made in accordance with conventional techniques.

The present invention involves a process for fabricating spacers used in nonvolatile memory devices, and in particular, processes for forming spacers various gate transistors in the periphery region of SONOS type nonvolatile memory devices. The present invention minimizes and/or eliminates damage to the substrate and/or the charge trapping layer in the core region while forming spacers in the periphery region of SONOS type nonvolatile memory devices. The present invention also permits the formation of gate transistors in the periphery region of SONOS type nonvolatile memory devices having two implanted regions of differing dosage levels (for example, a lightly doped drain and heavily doped drain).

The present invention may be employed for SONOS type non-volatile semiconductor memory devices having any configuration, including a NOR or NAND type configuration. The present invention may also be implemented by any of ROMs (read only memories), PROMs (programable read only memories), EPROMs (erasable programable read only memories), and EEPROMs (electrically erasable programable read only memories).

SONOS type non-volatile semiconductor memory devices contain SONOS type memory cells in the core region. A SONOS type memory cell has a poly layer positioned over a charge trapping dielectric, the charge trapping dielectric positioned over a tunnel oxide layer, the tunnel oxide layer positioned over a silicon substrate. Source and drain regions are positioned within the substrate near the edges of the memory cell. The poly layer may contain one of polysilicon, doped polysilicon, and doped amorphous silicon. The charge trapping dielectric typically contains three layers; namely, a first silicon dioxide layer, a silicon nitride layer, and a second silicon dioxide layer (an ONO charge trapping dielectric). Particularly in the case of an ONO dielectric, the electron trapping is in the silicon nitride layer.

The charge trapping dielectric may be any dielectric layer or layers that are capable of or facilitate electron trapping. In other words, to facilitate electron trapping, the charge trapping dielectric has a layer with a lower barrier height than the layers sandwiching it (two layers with relatively higher barrier heights sandwiching a layer with a relatively lower barrier height). In the case of an ONO trilayer dielectric, the oxide layers have a barrier height of about 3.1 eV whereas the nitride layer has a barrier height of about 2.1 eV. In this connection, a well is created in the middle layer.

Examples of charge trapping dielectrics include an ONO trilayer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), an oxide/hafnium oxide/oxide trilayer dielectric, and the like (in each case, the first layer mentioned is the bottom layer while the last layer mentioned is the top layer). Although the term SONOS type nonvolatile memory device is often used herein, it is to be understood that a SONOS type nonvolatile memory device as used herein may contain any of the charge trapping dielectrics described above. In other words, a SONOS type nonvolatile memory device contains any dielectric layer or layers that are capable of or facilitate electron trapping, and the SONOS type nonvolatile memory device contains an ONO charge trapping dielectric only when a specific reference to such dielectric is indicated.

Moreover, in the embodiments where the charge trapping dielectric is an ONO dielectric, one or both of the silicon dioxide layers may be a silicon-rich silicon dioxide layer. One or both of the silicon dioxide layers may also be an oxygen-rich silicon dioxide layer. One or both of the silicon dioxide layers may be a thermally grown or a deposited oxide. One or both of the silicon dioxide layers may be nitrided oxide layers. The nitride may be a silicon-rich silicon nitride layer. The nitride may also be an nitrogen-rich silicon nitride layer.

Figure 4:
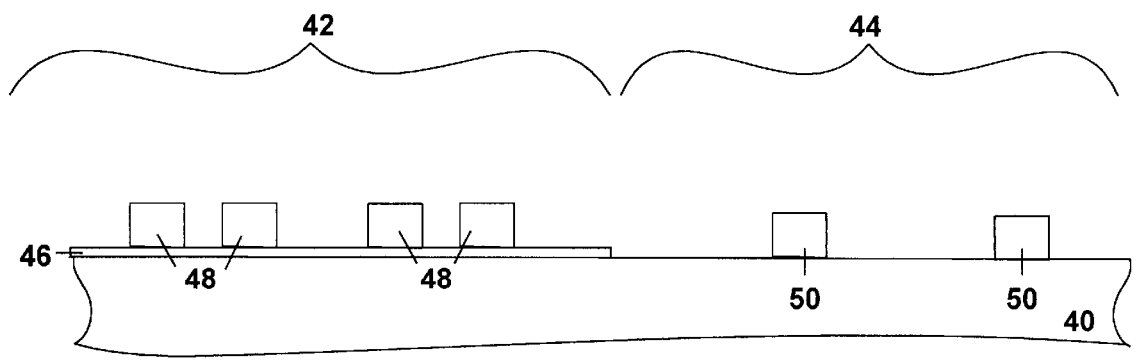
FIG. 4 illustrates a cross-sectional view of one aspect of a SONOS type memory device fabrication method in accordance with the present invention.

One aspect of the present invention is described in FIGS. 4–8, wherein the process for forming spacers in the periphery region of a SONOS type memory device is described. Referring to FIG. 4, a semiconductor substrate 40 is provided. Semiconductor substrate 40 contains two regions, the core region 42 containing memory cells 48 and the periphery region 44 containing the rest of the chip such as the controlling logic and input/output devices (the gate transistors 50 of which may include select gate transistors, high voltage gate transistors, and low voltage gate transistors). A charge trapping dielectric 46 is positioned in the core region 42. The memory cells 48 are SONOS type memory cells. The memory cells 48 and periphery gate transistors 50 may be completely, substantially, or partially formed on the substrate 40.

Although not shown in FIGS. 4 to 8, the semiconductor substrate 40 may contain other layers, structures, and devices. For example, semiconductor substrate 40 may have a tunnel oxide layer, bitline contacts, and/or wordline contacts thereover.

An implant is performed in the core region 42 and periphery region 44 (simultaneously or at different times). In the core region 42, bit lines (not shown) are formed while in the periphery region 44, lightly doped drains are formed. The semiconductor substrate 40 is optionally annealed at a suitable temperature after the implantation. The implants are introduced into the substrate 40 adjacent the memory cells 48 and the gate transistors 50.

One or more suitable implantation materials may be employed. The selection of implantation materials primarily depends on the type of substrate employed, for example, whether a p-type or n-type is used, and the identity of a threshold implant. Examples of implantation materials include one or more of arsenic, boron, and phosphorus. In one embodiment, an n+ dopant is employed for implantation. In another embodiment, a p+ dopant is employed for implantation. The implantation is conducted to achieve a suitable dosage.

The implantation in the core region 42 and periphery region 44 may be conducted at the same time (using the same or different implantation materials at the same or different dosages), or at different times using two different masks (using the same or different implantation materials at the same or different dosages). When implantation in the core region 42 and periphery region 44 is conducted at different times using two different masks, either the core region 42 is initially masked and materials are implanted into the periphery region 44 followed by masking the periphery region 44 and implanting materials into the core region 42 or the periphery region 44 is initially masked and materials are implanted into the core region 42 followed by masking the core region 42 and implanting materials into the periphery region 44.

Figure 5:
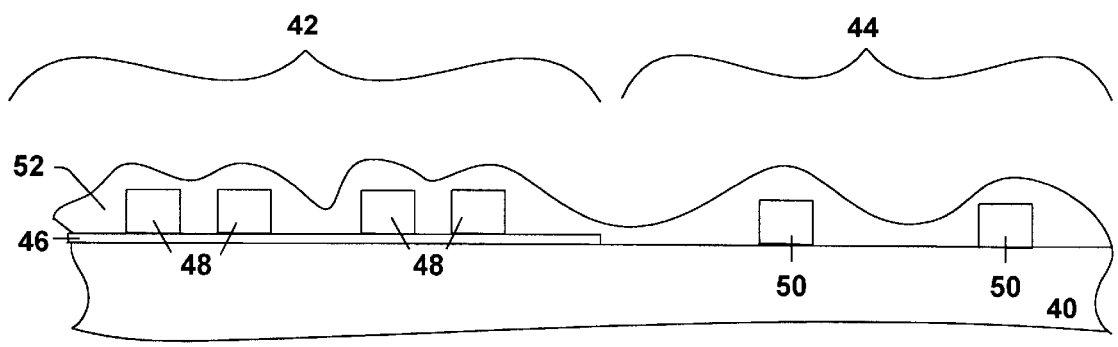
FIG. 5 illustrates a cross-sectional view of another aspect of a SONOS type memory device fabrication method in accordance with the present invention.

Referring to FIG. 5, a spacer material 52 is formed over the substrate 40. The spacer material 52 may contain any suitable insulation material, including one or more of silicon dioxide, silicon nitride, and silicon oxynitride. The spacer material 52 may alternatively contain a glass or silicate such as one or more of tetraethylorthosilicate (TEOS), borophosphotetraethylorthosilicate (BPTEOS), phosphosilicate glass (PSG), or borophosphosilicate glass (BPSG), and the like. The spacer material 52 is deposited by any suitable means, such as chemical vapor deposition (CVD) or spin-on techniques. The spacer material 52 is deposited so that it covers the memory cells 48 in the core region 42 and the gate transistors 50 in the periphery region 44, preferably in a conformal or semi-conformal manner.

Figure 6:
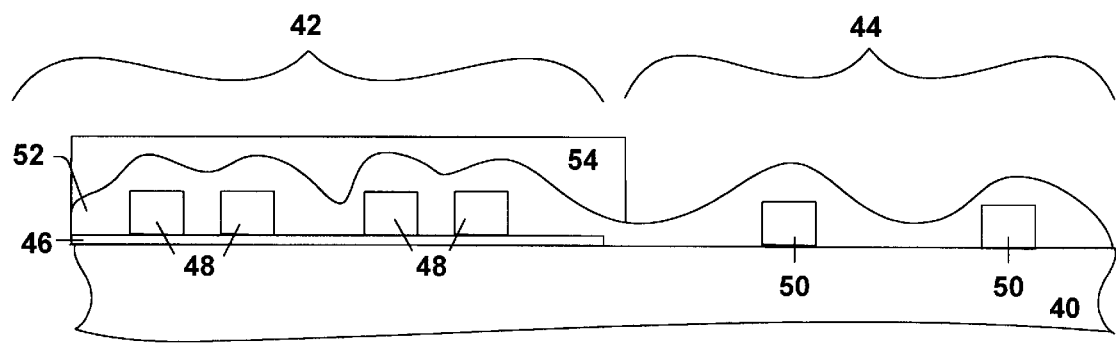
FIG. 6 illustrates a cross-sectional view of yet another aspect of a SONOS type memory device fabrication method in accordance with the present invention.

Referring to FIG. 6, a mask such as a suitable photoresist 54 is used to cover the core region 42 while leaving the periphery region 44 exposed. That is, a photoresist material is deposited over the substrate 40 and patterned to mask the core region 42 leaving the spacer material 52 exposed in the periphery region 44.

Figure 7:
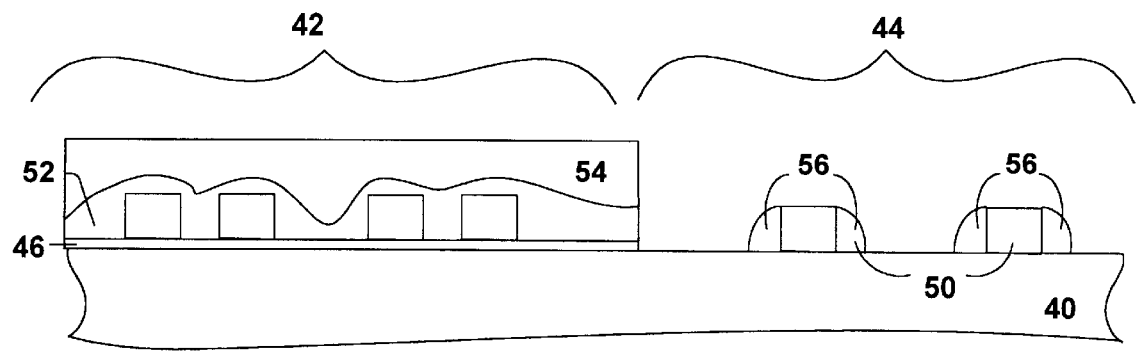
FIG. 7 illustrates a cross-sectional view of still yet another aspect of a SONOS type memory device fabrication method in accordance with the present invention.

Referring to FIG. 7, a portion of the spacer material 52 exposed in the periphery region 44 is etched to form spacers 56. The spacer material 52 is etched in an anisotropic manner with a suitable plasma so that portions of the spacer material 52 are removed from the top of the gate transistors 50 and from most of the surrounding substrate 40 surface (or tunnel oxide surface, not shown) while a portion of the spacer material 52 remains adjacent the gate transistors 50 to form spacers 56. Since the spacer material 52 is not etched in the core region 42, damage to the charge trapping dielectric 46 and substrate 40 is minimized and/or eliminated.

After spacers 56 are formed, another implant is performed in the periphery region 44. The photoresist 54 prevents the ions from contacting the substrate 40 in the core region 42. The semiconductor substrate 40 is optionally annealed at a suitable temperature after the implantation. Due to the presence of the spacers 56, the implants are introduced into the substrate 40 a safe distance from directly underneath the gate transistors 50, permitting the formation of a heavily doped implanted region adjacent the lightly doped implanted region. Consequently, periphery transistors with both relatively light and relatively heavy doping may be formed.

One or more suitable implantation materials may be employed. The selection of implantation materials primarily depends on the type of substrate employed, for example, whether a p-type or n-type is used, and the type of implant employed to form the buried bit lines and threshold implant (not shown). Examples of implantation materials include one or more of arsenic, boron, and phosphorus. In one embodiment, an n+ dopant is employed for the heavy implantation. In another embodiment, a p+ dopant is employed for heavy implantation. The heavy implantation is conducted to achieve a suitable dosage.

Although the first implant into the periphery region 44 forms a lightly doped source/drain and the second implant forms a heavily doped source/drain, the first implant may form a heavily doped source/drain and the second implant may form a lightly doped source/drain. In other words, the first and second implants may be implanted at different dosage levels.

Figure 8:
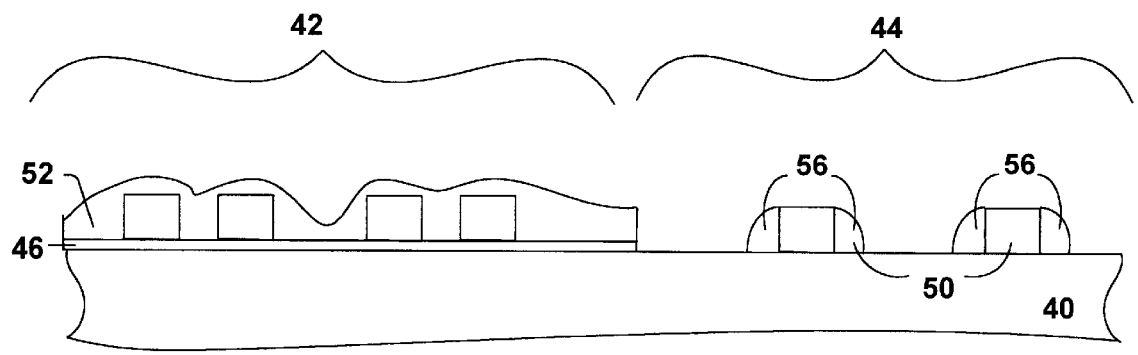
FIG. 8 illustrates a cross-sectional view of another aspect of a SONOS type memory device fabrication method in accordance with the present invention.

Referring to FIG. 8, the photoresist 54 is removed or stripped from the substrate 40 to provide a non-volatile memory substrate having periphery transistors 50 with spacers 56. The spacer forming process of the present invention minimizes the occurrence of damage to the substrate and/or charge trapping dielectric. The spacer material 52 in the core region 42 may serve to encapsulate and thus further insulate the SONOS type memory cells 48.

Although not shown, further processing is performed to complete the fabrication of the SONOS type flash memory devices. For example, buried bit lines are formed, further implants are incorporated into the substrate, contacts, salicidation, completion of formation of memory cells, select gate transistors, high voltage gate transistors, and low voltage gate transistors, I/O circuitry, and so on are formed.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means")used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming spacers in a silicon-oxide-nitride-oxide-silicon (SONOS) type nonvolatile semiconductor memory device, comprising:

providing a semiconductor substrate having a core region and periphery region, the core region comprising SONOS type memory cells and the periphery region comprising gate transistors;

implanting a first implant into the core region and a first implant into the periphery region of the semiconductor substrate;

forming a spacer material over the semiconductor substrate;

masking the core region and forming spacers adjacent the gate transistors in the periphery region; and implanting a second implant into the periphery region of the semiconductor substrate.

2. The method according to claim 1, wherein the spacer material comprises silicon dioxide, silicon nitride, silicon oxynitride, tetraethylorthosilicate, borophosphotetraethylorthosilicate, phosphosilicate glass, or borophosphosilicate glass.

3. The method according to claim 1, wherein the spacer material is formed by chemical vapor deposition techniques.

4. The method according to claim 1, wherein the spacers adjacent the gate transistors in the periphery region are formed by anisotropic etching.

5. The method according to claim 1, wherein the first implant is implanted at a first dosage into the periphery region and the second implant is implanted at a second dosage into the periphery region.

6. The method according to claim 1, wherein the spacer material encapsulates the SONOS type memory cells and the gate transistors.

7. A method of forming spacers in a silicon-oxide-nitride-oxide-silicon (SONOS) type nonvolatile semiconductor memory device, comprising:

providing a semiconductor substrate having a core region and periphery region, the core region comprising SONOS type memory cells and the periphery region comprising gate transistors, the SONOS type memory cells comprising a charge trapping dielectric and a poly layer;

implanting a first implant into the core region and a first implant into the periphery region of the semiconductor substrate;

depositing a spacer material over the semiconductor substrate in a substantially conformal manner;

masking the core region and forming spacers adjacent the gate transistors in the periphery region by etching a portion of the spacer material over the periphery region; and implanting a second implant into the periphery region of the semiconductor substrate.

8. The method according to claim 7, wherein the spacer material comprises silicon dioxide, silicon nitride, silicon oxynitride, tetraethylorthosilicate, borophosphotetraethylorthosilicate, phosphosilicate glass, or borophosphosilicate glass.

9. The method according to claim 7, wherein the spacer material is deposited by chemical vapor deposition.

10. The method according to claim 7, wherein the spacers adjacent the gate transistors in the periphery region are formed by anisotropic etching.

11. The method according to claim 7, wherein the first and second implants independently comprise at least one of arsenic, boron, and phosphorus.

12. The method according to claim 7, wherein the first implant is implanted at a first dosage into the periphery region and the second implant is implanted at a second dosage into the periphery region.

13. The method according to claim 12, wherein the second dosage is greater than the first dosage.

14. The method according to claim 7, wherein the charge trapping dielectric comprises one of an ONO trilayer dielectric, an oxide/nitride bilayer dielectric, a nitride/oxide bilayer dielectric, an oxide/tantalum oxide bilayer dielectric, an oxide/tantalum oxide/oxide trilayer dielectric, an oxide/strontium titanate bilayer dielectric, an oxide/barium strontium titanate bilayer dielectric, an oxide/strontium titanate/oxide trilayer dielectric, an oxide/strontium titanate/barium strontium titanate trilayer dielectric, and an oxide/hafnium oxide/oxide trilayer dielectric.

15. A method of forming spacers in a silicon-oxide-nitride-oxide-silicon (SONOS) type nonvolatile semiconductor memory device, comprising:

provind a semiconductor substrate having a core region and periphery region, the core region comprising SONOS type memory cells and the periphery region comprising gate transistors, the SONOS type memory cells comprising a charge trapping dielectric and a poly layer;

implanting a first implant into the core region to form buried bit lines in the substrate adjacent the SONOS type memory cells and a first implant into the periphery region to form lightly doped regions in the substrate adjacent the gate transistors;

depositing a spacer material over the semiconductor substrate in a substantially conformal manner;

masking the core region and forming spacers adjacent the gate transistors in the periphery region by etching a portion of the spacer material over the periphery region; and implanting a second implant into the periphery region to form heavily doped regions in the substrate adjacent the lightly doped regions.

16. The method according to claim 15, wherein the spacer material comprises silicon dioxide, silicon nitride, silicon oxynitride, tetraethylorthosilicate, borophosphotetraethylorthosilicate, phosphosilicate glass, or borophosphosilicate glass.

17. The method according to claim 15, wherein etching the portion of the spacer material over the periphery region is conducted in an anisotropic manner.

18. The method according to claim 15, wherein the charge trapping dielectric comprises one of an ONO trilayer dielectric, an oxide/nitride bilayer dielectric, a nitride/oxide bilayer dielectric, an oxide/tantalum oxide bilayer dielectric, an oxide/tantalum oxide/oxide trilayer dielectric, an oxide/strontium titanate bilayer dielectric, an oxide/barium strontium titanate bilayer dielectric, an oxide/strontium titanate/oxide trilayer dielectric, an oxide/strontium titanate/barium strontium titanate trilayer dielectric, and an oxide/hafnium oxide/oxide trilayer dielectric.

19. The method according to claim 15, wherein the charge trapping dielectric comprises an ONO dielectric comprising at least one of a nitrided oxide layer and a silicon-rich silicon nitride layer.

20. The method according to claim 15, wherein the first and second implants independently comprise at least one of arsenic, boron, and phosphorus.

* * * * *